US009282651B2

(12) United States Patent
Faraci et al.

(10) Patent No.: US 9,282,651 B2
(45) Date of Patent: Mar. 8, 2016

(54) SYSTEM FOR MANUFACTURING LAMINATED CIRCUIT BOARDS

(71) Applicant: DUETTO INTEGRATED SYSTEMS, INC., Islandia, NY (US)

(72) Inventors: Anthony Faraci, Commack, NY (US); Gary N. Sortino, Baldwin, NY (US)

(73) Assignee: DUETTO INTEGRATED SYSTEMS, INC., Islandia, NY (US)

( * ) Notice: Subject to any disclaimer, the term of this patent is extended or adjusted under 35 U.S.C. 154(b) by 28 days.

(21) Appl. No.: 14/341,901

(22) Filed: Jul. 28, 2014

(65) Prior Publication Data

US 2014/0332162 A1     Nov. 13, 2014

Related U.S. Application Data

(63) Continuation of application No. 14/047,183, filed on Oct. 7, 2013, now Pat. No. 8,831,918, which is a continuation of application No. 13/247,574, filed on Sep. 28, 2011, now Pat. No. 8,594,983, which is a continuation of application No. 12/208,972, filed on Sep. 11, 2008, now Pat. No. 8,065,121, and a continuation of application No. PCT/US2007/064435, filed on Mar. 20, 2007.

(60) Provisional application No. 60/783,888, filed on Mar. 20, 2006.

(51) Int. Cl.
    *H05K 3/00*          (2006.01)
    *H05K 3/46*          (2006.01)
    *H05K 1/02*          (2006.01)

(52) U.S. Cl.
CPC ............... *H05K 3/4638* (2013.01); *H05K 3/00* (2013.01); *H05K 1/0269* (2013.01); *H05K 2201/09918* (2013.01); *H05K 2203/06* (2013.01); *H05K 2203/065* (2013.01); *H05K 2203/101* (2013.01); *H05K 2203/107* (2013.01); *H05K 2203/1476* (2013.01); *H05K 2203/166* (2013.01); *Y10T 29/49126* (2015.01); *Y10T 29/49213* (2015.01); *Y10T 29/5317* (2015.01); *Y10T 29/53087* (2015.01)

(58) Field of Classification Search
CPC . H05K 3/4638; H05K 3/00; H05K 2203/166; H05K 1/0269; H05K 2201/09918; H05K 2203/06; H05K 2203/065; H05K 2203/101; H05K 2203/107; H05K 2203/1476; Y10T 29/49126; Y10T 29/49213; Y10T 29/53087
See application file for complete search history.

(56) References Cited

U.S. PATENT DOCUMENTS

| | | | | |
|---|---|---|---|---|
| 5,768,759 A | * | 6/1998 | Hudson | H05K 13/0413 29/407.04 |
| 5,768,772 A | * | 6/1998 | Buechele | H05K 3/4638 29/464 |
| 6,229,124 B1 | | 5/2001 | Trucco | |
| 6,367,678 B1 | * | 4/2002 | Ammann | H05K 3/4638 228/103 |
| 7,161,122 B2 | * | 1/2007 | DeBonis | H05B 6/105 219/603 |
| 7,649,159 B2 | * | 1/2010 | Matsuura | B23K 1/002 219/615 |

* cited by examiner

*Primary Examiner* — Minh Trinh
(74) *Attorney, Agent, or Firm* — Andrew F. Young, Esq.; Lackenbach Siegel, LLP

(57) ABSTRACT

The present invention relates to a pin-less registration and inductive heating system involving the use of a pre-alignment station for imaging an initial position of a laminate element, an imaging and computer operation control system for determining a required correction factor between an alignment of the laminate element at the pre-alignment station and a preferred stack orientation for the laminate element, and an alignment and transfer system for securely gripping, transferring, and repositioning a laminate element from a top position to the preferred stack orientation employing a preferred four-axis orientation.

2 Claims, 18 Drawing Sheets

FIG. 1

(PRIOR ART)

Table I

| Tolerance Type | Typical Range | Figure |
|---|---|---|
| Punched hole size variation due to thickness of laminate on inner layer. | ± 25 micron (± 0.001 inch) | 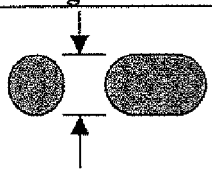 |
| Location tolerance of slot to slot on inner layer. | ± 13 micron (± 0.0005 inch) | 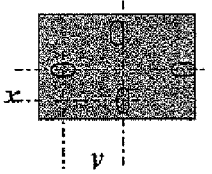 |
| Location tolerance of image to punched slot on inner layer. | ± 25 micron (± 0.001 inch) | 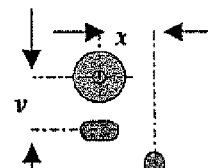 |
| Location tolerance of bushing in lamination plates. | ± 25 micron (± 0.001 inch) | 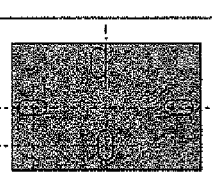 |
| Location tolerance of slot to center of bushing. | ± 8 micron (± 0.0003 inch) | 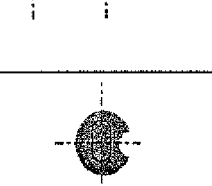 |
| Lamination pin size. | ± 8 micron (± 0.0003 inch) | 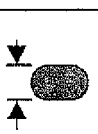 |

FIG.2
(PRIOR ART)
Table 2
| Tolerance Type | Typical Range | Figure |
|---|---|---|
| Rivet size variation, tolerance increases with different quality rivets (squared/rounded profile). | ± 25 micron (± 0.001 inch) | 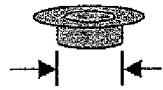 |
| Alignment tolerance of tooling and tooling wear. | ± 25 micron (± 0.001 inch) | 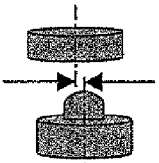 |
| Layer shift due to rivet distortion. | ±??? micron (± 0.??? inch) |  |

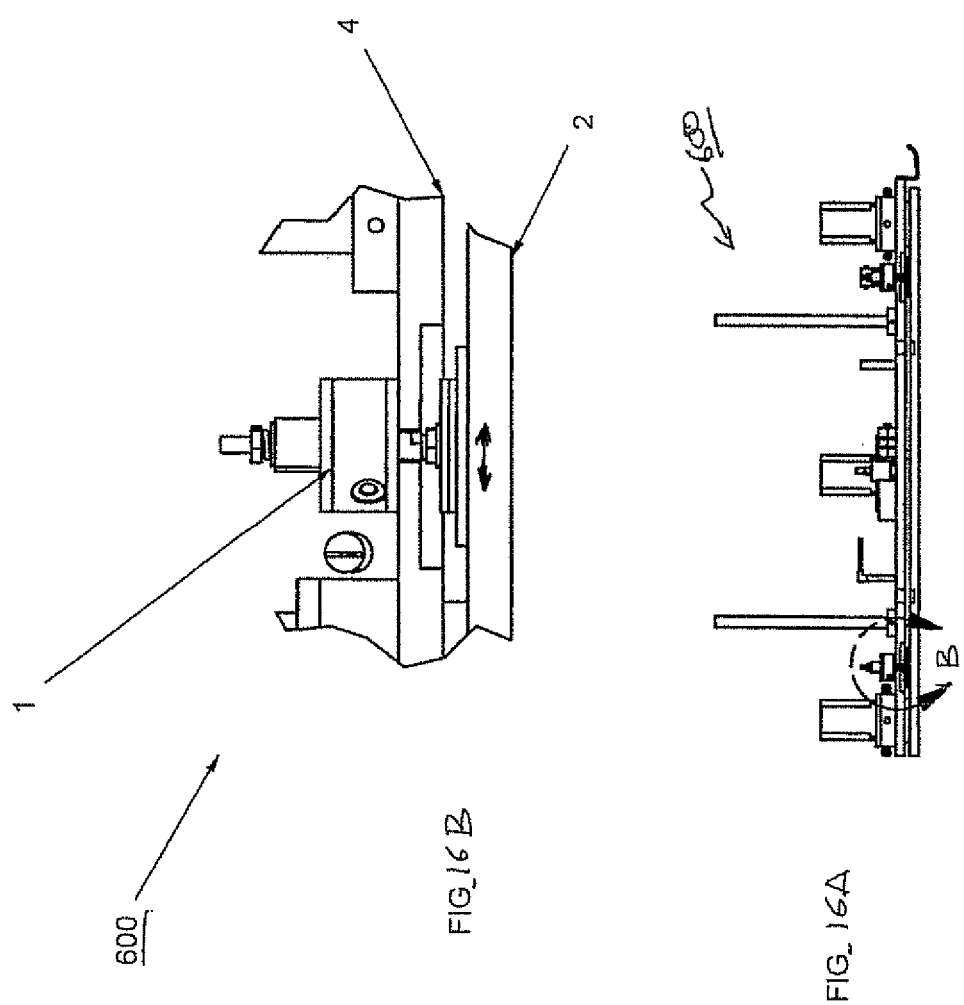

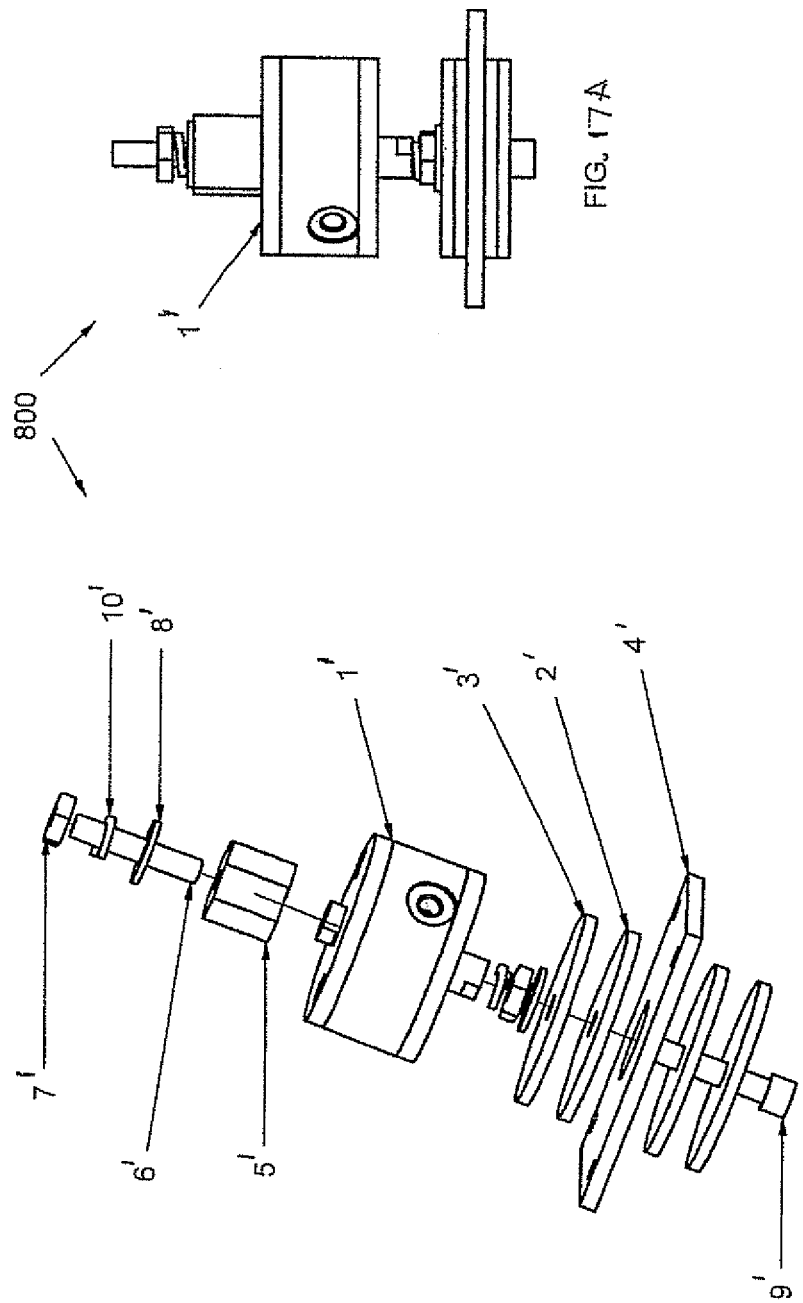

SYSTEM FOR MANUFACTURING LAMINATED CIRCUIT BOARDS

CROSS REFERENCE TO RELATED APPLICATIONS

This Application claims priority from and is a continuation of U.S. Ser. No. 14/047,183 filed Oct. 7, 2013, allowed, which is a continuation of U.S. Ser. No. 13/247,574 filed Sep. 28, 2011, now U.S. Pat. No. 8,594,983, which is a continuation of U.S. Ser. No. 12/208,972 filed Sep. 11, 2008 now U.S. Pat. No. 8,065,121, which in turn is a continuation of PCT/US07/64435 filed Mar. 20, 2007 which claims priority from U.S. Prov. App. Ser. No. 60/783,888 filed Mar. 20, 2006, the entire contents of each of which are herein incorporated by reference.

FIGURE FOR PUBLICATION

FIG. 8

BACKGROUND OF THE INVENTION

1. Field of the Invention

The present invention relates to an improved system and method for manufacturing laminated structures. More specifically, the present invention relates to an improved system and method for minimizing initial alignment error in printed circuit board (PCB) manufacturing.

2. Description of the Related Art

The related art involves a process for producing printed electronic circuits, including multilayer circuits by endothermic induction heading as discussed in PCT/IT2003/000403 by Ceraso, et al., (published as WO 2004/103042) [the Ceraso system] the entire contents of which are herein incorporated by reference.

In the Ceraso process and system, plastic laminates with copper laminae for electronic circuits are provided including multilayer circuits, a cold press secures an endothermic heating pile of a plurality of packages. During processing, a ferromagnetic core having an alternating current winding is positioned proximate the endothermic heating pile and induces an inductive field within the copper laminae to warm the heating pile (which includes resin sheets (also known commonly as "pre-preg")), and laminate the individual layers together.

The solution created by this reference eliminates several of the detriments known in the related-art heating techniques for rapidly forming multilayer laminates, and has been widely adopted by the industry as a result. Unfortunately, the Ceraso process, while more rapid, fails to enhance accuracy and commonly incurs higher quality control loses.

Thus, while the present discussion incorporates fully the entire detailed disclosure of this reference nothing herein shall prevent the systems and devices discussed herein from employing the alternative forms of laminate heating and sealing discussed within the Ceraso reference, as noted above noted above.

A. Tooling Alignment Systems

The related art involves the use of different types of alignment systems each offering advantages and disadvantages. Presently these differing types include "pin-based" and "riveted-type" registration systems in laminated structure manufacturing. While each system succeeds in fixing multiple laminated structures relative to each other, each system also provides an unacceptable alignment tolerance level addressed by the present invention.

There are many tolerances associated with the production of a circuit board. Unfortunately, these combined errors or "tolerance errors" build up throughout the course of lamination imaging and lamination tooling and ultimately have an exponential impact on alignment accuracy. With the increasing reduction in dimensional circuit design these tolerance errors are unacceptable. We will examine the punched or drilled hole tolerances below, at different stages of the manufacturing process.

The tolerance or alignment errors resulting from conventional alignment systems are also revealed through the process of imaging inner layers of an assembled block of laminated members. Imaging inner layers reveals internal alignment errors.

When imaging inner layers, imaging for front-to-back is typically performed using two methods, (i) pinning the artwork to holes on the inner layer or (ii) roughly imaging the circuit pattern to the edges of the inner layer (so called edge-imaging).

In the first method, the conventional tooling holes that were used to image the circuit pattern on the inner layer are also used to align the layers to each other in lamination. The downside to this method is that typically the same holes are used; and consequently, any distortion relative to these holes will have a negative affect as the inner layer is processed throughout the remainder of the lamination process. This problem is greatly affected during lay-up and as the layer thickness is reduced.

In the second method (edge imaging), the hole tolerance for imaging has been eliminated, and this is much more accurate as camera assisted imaging is now possible. The newer exposure machines can now align the front and back artwork via a CCD camera positioning system, by doing so they minimize the tolerances of the punches holes in the artwork as well as in the innerlayers. Unfortunately, this edge imaging method still requires the use of holes for ultimate alignment of a completed lamination and hence still incurs alignment error.

A conventional manufacturing step involves attempting to align the layers prior to lamination. This step in the manufacturing process is conventionally accomplished by many different methods; the most common methods in use today are pin lamination, riveting, and pin bonding.

In "pin Lamination," systems the most common tooling pattern is the 4-slot centerline tooling. The main advantage of this tooling scheme is that it allows for easier lay-up than lay-up on four round holes. The slots compensate any material movement in the etching process (allowing and encouraging X-Y shifting), whereas the use of simply four round holes would cause distortion on the inner layer when pinned to four-fixed pin in a lamination plate (four round hoes prevents shifting between layers causing gapping, and ultimately layer shifting. So if the slots are used it is conventionally easier to lay-up and buckling is similarly minimized, but there are many tolerances error associated with this process. Unfortunately, these tolerances exist regardless of the numbers of cameras used on a post-etch punch process.

Referring now to FIG. 1, in reviewing the impact of punch and slot alignment systems, the multiple error-sources are noted on Table 1 (FIG. 1) along with the associated error ranges. In reviewing FIG. 1 (Table 1), it should be noted that even under the best conditions, layer-to-layer registration capability with pin lamination is at best approximately 50-75 microns (um).

Finally, as a further disadvantage in the conventional alignment arts, pin lamination is not flexible when changing panel sizes, shifting between panel sizes for custom lamination sets, etc. When changing panel sizes, a customer needs to purchase different lamination and separator plates for each panel size to be processed, and this is extremely expensive.

Referring now to FIG. 2 (Table 2), in conventional "riveting systems," the main advantage of this tooling scheme is that it allows for more flexibility in selection of panel sizes than pin lamination (because rivet holes may be positioned as needed). Unfortunately, this process also has many of the same detrimental tolerance issues.

These detrimental tolerance issues include the need to line-up holes target locations prior to riveting, the need to punch or drill the holes, and ultimately after hole-creation the layers must be placed on pins prior to riveting to maintain alignment during the riveting process. In sum, the conventional riveting system tooling hole tolerances are the same as in pin lamination, but there are also the following tolerances associated with riveting. These tolerances are summarized generally in FIG. 2.

As noted in FIG. 2, the layer shift due to rivet distortion itself is a mechanical error that is very difficult to overcome, thus making the riveting generally a process for low layer count and low-density boards.

Finally, in conventional "pin bonding systems," much like riveting, the main advantage of this tooling scheme is that it allows for more flexibility in choosing panel sizes than in the above-discussed pin lamination systems. Unfortunately, pin bonding systems also possess some of the same tolerances.

The tolerance issues in pin bonding systems include that the line-up holes prior to bonding must be punched or drilled, and that the layers must be physically or mechanically placed on pins prior to bonding for the alignment. These tooling hole tolerances and the positioning tolerances are the same as in pin lamination.

Ultimately, after conventional alignment systems the bonding process, whether accomplished by hot heads, ultrasonic or inductive is essentially the same. During initial bonding, the so called pre-preg (resin sheets) at certain points, typically at six points on the long edge of the panel, is heated so that the resin forms a bond point between sheets. During this conventional bonding process, the results from pin bonding are usually better than pin lamination; and this is because the lay-up is performed on the same template for a certain panel size. This is because in conventional pin lamination the lay-up is on long pins and on different lamination plates that have different tolerances from pin to pin.

Of the different methods discussed, the pin bonding is the most flexible, this eliminates the costly tooled lamination and separator plates, the copper foil does not need to be punched, and there are no consumables required, such as lamination pins or rivets.

Ultimately, what is not appreciated by the prior art is: (a) the need for a highly accurate and repeatable circuit board laminate registration system that is flexible, particularly one that does not magnify error in a multi-layer set-up, but remains instead within a predictable and calculable tolerance range; (b) the need for a repeatable alignment system and structure that enables induced heating for multi-layer systems; (c) the need for a pre-alignment and imaging station for determining a pre-assembly assignment position; and (d) the need for an in-situ pin-less-alignment system.

Accordingly, there is a need for an improved system and method for manufacturing laminated structures that responds to the needs noted above.

SUMMARY OF THE INVENTION

The present invention relates to an improved pre-alignment and feed table system for managing laminate elements, a pin-less optical based alignment (registration) system (a pin-less registration system—PRS) allowing sequential non-edge registered lay-ups, a computer managed monitoring and vision system for managing the same, and a system incorporating inductive bonding for manufacturing laminated structures, particularly multi-layered circuit boards.

In further detail, the present invention relates to a pin-less registration and inductive heating system involving the use of a pre-alignment station for imaging an initial position of a laminate element, an imaging and computer operation control system for determining a required correction factor between an alignment of the laminate element at the pre-alignment station and a preferred stack orientation for the laminate element, and an alignment and transfer system for securely gripping, transferring, and accurately repositioning a laminate element from a top position to the preferred stack orientation employing a preferred four-axis orientation.

A benefit of the proposed invention is to provide an improved materials handling system for rapidly forming laminated structures with reduced loss, improved yields and handling speeds and improved layer-to-layer alignment accuracy.

Another proposed benefit of the present invention is to provide an alternative pin-less alignment system that overcomes the detriments noted above.

It another proposed benefit of the present invention to provide a computer management and operation system that enables a pin-less alignment system for creating multi-laminate structures.

According to an embodiment of the present invention there is provided an improved system and method for manufacturing laminated structures, comprising: pin-less registration system means for initially imaging portions of a preloaded laminate structure and for determining a first reference orientation data set relative to an alignment table; computer means for receiving the first reference orientation data set, for determining a preferred stack orientation of the laminate structure based on the orientation data, and for calculating an orientation correction factor to match the preloaded laminate structure to a preferred stack orientation; and a device for alignment, griping and transferring means for receiving instructions from the computer system and for transferring the preloaded laminate structure to the preferred stack orientation; and means for inductively heating at least one laminate structure at the preferred stack location and ultimately to thereby register a plurality of laminates to the preferred stack orientation.

According to another embodiment of the present invention there is provided an improved system and method for manufacturing laminated structures wherein: the pin-less registration means further comprises: at least a first computer imaging system means for locating an initial position of the preloaded laminate structure relative to a reference system; at least a second computer imaging system for locating additional imaging targets on the preferred stack orientation of the laminate structure; and means for transmitting data related to the initial position and the preferred stack orientation to the computer means, whereby the computer means calculates the correction factor.

The above, and other proposed benefits, features and advantages of the present invention will become apparent from the following description read in conduction with the accompanying drawings, in which like reference numerals designate the same elements.

BRIEF DESCRIPTION OF THE DRAWINGS

FIG. 1 is a table (Table 1) of conventional alignment errors for punched hole and slot type systems.

FIG. 2 is a table (Table 2) of conventional riveting alignment errors in a riveting type alignment system.

FIG. 16A is a side view of an alignment assembly as in FIG. 11 noting close up detail B.

FIG. 16B is a cut-away side view of a slide bearing assembly from detail B in FIG. 16A.

FIG. 17 is an exploded perspective view of a bearing assembly.

FIG. 17A is a side assembled view of the bearing in FIG. 17.

DETAILED DESCRIPTION OF THE PREFERRED EMBODIMENTS

Figure 3A:
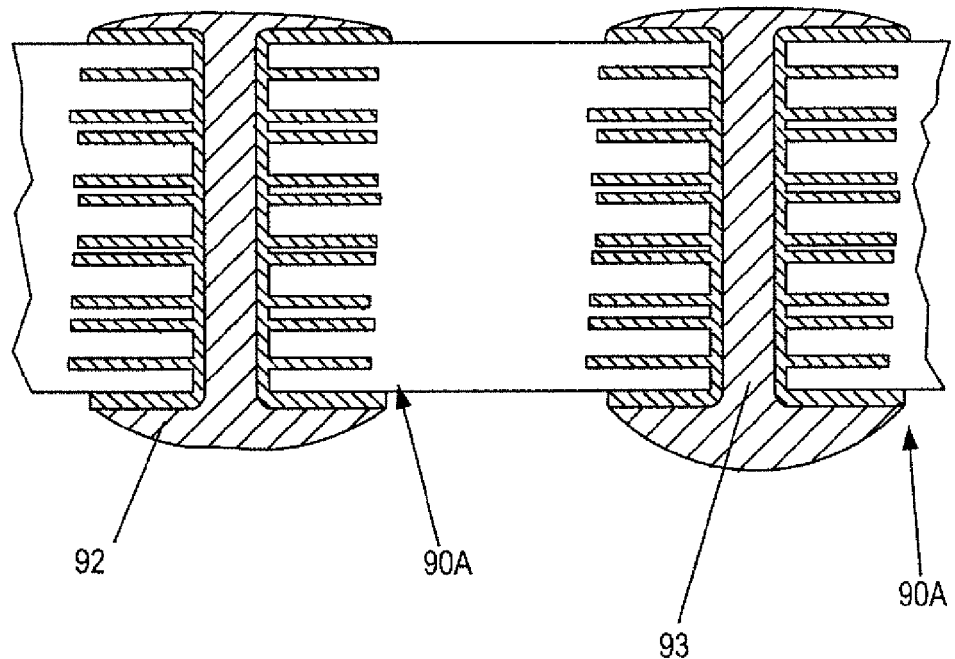
FIGS. 3A and 3B represent a cross-sectional view of the proposed pin-less registration system following lamination and post-bonding with FIG. 3A including non-uniform layers and FIG. 3B including uniform layers.

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

A. Benefits of a Pin-Less Registration System (PRS)—Initial Overview

In the presently proposed "Pin-Less Registration System," the system combines the alignment accuracy of a CCD camera positioning system with the advantages of a bonding system. Layer to layer alignment is greatly increased by eliminating all the tooling holes and their associated tolerances. There is also no need to punch holes in the prepreg, thus this is a cleaner operation.

The layer-to-layer alignment and bonding is performed on one unit prior to lamination. This makes it possible to align internal layers and place them on lamination plates immediately. With all other tooling schemes the layers would all need to be punched or drilled before lay-up could began. Pin-less registration eliminates this extra step, and by doing so also eliminates the extra handling of the layers.

There are many advantages to pin-less registration, from handling, to speed, to improved yields, but the most important is the accuracy of layer-to-layer alignment. In order to have the best possible registered boards, its important to have the inner layers in the best possible alignment as the boards go into the lamination press. The only tooling method that can provide these results is the pin-less Registration System.

Figure 3B:
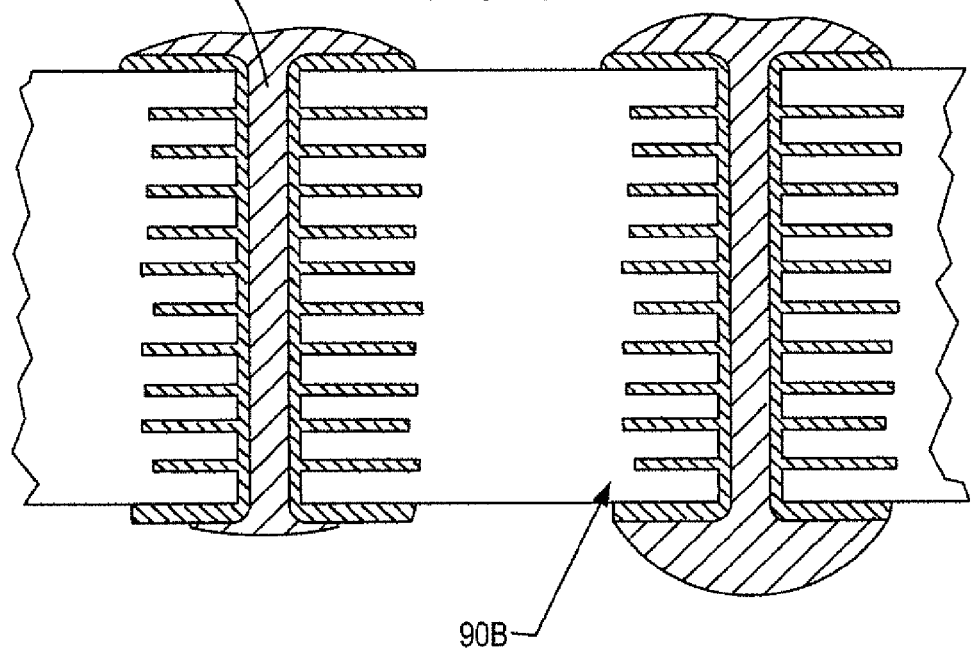

Referring now to FIGS. 3A and 3B, exemplary cross-sectional views of the proposed pin-less registration system (PRS) are provided, noting a typical cross sections reflecting high aspect ratio holes with good layer-to-layer registration. It is noted that in the proposed pin-less registration system, layer-to-layer registration accuracy is held to +/−17 micron.

As noted a plurality of layers 90, including thinner layers 90A and standard thickness layers 90B, are provided following alignment, bonding, and lamination or drilling of a hole 93 thorough a series of copper traces 92 formed in desired regions. As can be seen there are trapped air regions between the layers (voids) occasionally, and that these regions or variations do not detrimentally impact the proposed alignment system.

As will be later discussed, the noted cross-sections in FIGS. 3A, 3B are following pin-registration, and consequently it will be recognized by those of skill in the art that the proposed system and process may be readily integrated into a review of pre-pressroom processing, book lay-up (with pins and w/o pins), and drill tooling and flash routing, thereby enabling ready integration of the proposed invention into conventional systems.

Pre-Pressroom Processing:

As will be later discussed in detail, pin-less registration starts out by saving substantial labor and operational cycle time. Because the system relies on a proposed vision alignment system having a camera measurement station (CMS) that may also be employed for post-etch punching no additional phototool process changes are required (however, post-etch punching process is eliminated completely). Once the internal layers are aligned in the pin-less registration system (PRS) and then bonded, the bonded layers then lay up like a simple 4 layer board. This process eliminates the extra labor currently used to manually punch and align all the layers.

Figure 4:
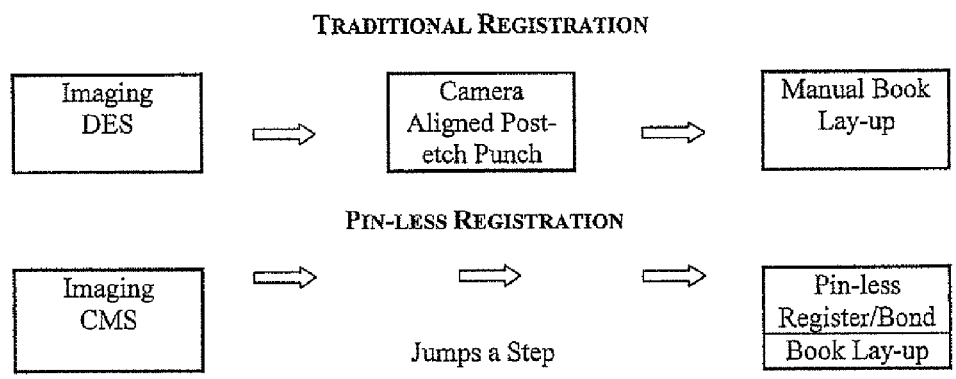
FIG. 4 is a graphic comparison between traditional registration and the proposed pin-less registration.

Referring now to FIG. 4, an graphical image of the removal of a conventional step in the proposed pin-less registration system is depicted. As will be noted, the proposed system provides a camera measurement station (CMS) including preferably ten (10) imaging cameras, as will be discussed below that then supports the additionally proposed pin-less registration (PRS) system so that in either alternative of joint use a substantial alignment benefit is provided. In contrast, the traditional registration system employs a conventional digital electronic system (DES) for tracking top-only targets on a laminate sheet and requires pin alignment.

As will be noted in FIG. 4, the proposed PRS and CMS systems enable conventional book lay-up with out alignment pins to hold bonded packages together between separator plates.

Book Lay-up of previously-bonded internal layers made using the proposed PRS system can be performed using the following two general techniques. Some presses have spring loaded corner blocks on the carrier plates to hold the assembled book in location, while others rely on the operator to center the lamination plates on the carrier sheets. Employing the proposed PRS system the process is able to align and weld internal layers without pins in a book lay-up process.

As a benefit of the provided PRS system, after the internal layers are aligned and bonded there are later book lay-up process benefits: including (1) lamination plates do not need tooling holes, (2) separator plates do not need tooling holes, (3) copper foil does not need clearances for tooling pins, (4) prepreg (resin layer) does not need clearances for tooling pins, (5) and the existing lay-up tables have two lasers for rough edge alignment providing two perpendicular lines to rapidly align the bonded package.

Figure 5:
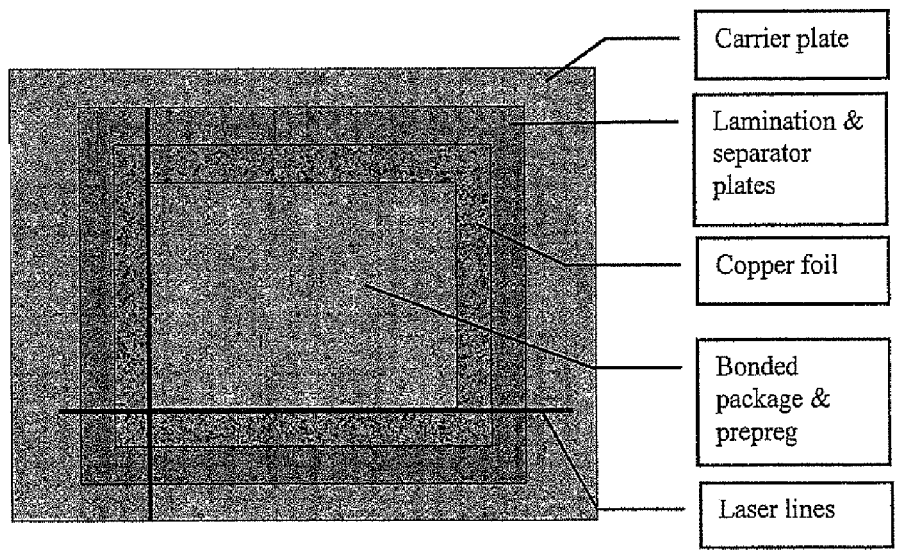
FIG. 5 is an exemplary image of a lay-up book without holding pins enabled by one aspect of the proposed invention.

Referring now to FIG. 5 a representative example of the lay-up book construction without external holding pins is provided.

The following is a proposed process for laying up a book without external holding pins—for example a laying up a 10 layer board employing lamination and separator plates having no tooling holes as enabled by the present PRS system.
1. Place the lower lamination plate in position on the lay-up table and begin lay-up as usual up to the first separator plate.
2. After placing the first separator plate in location, place the untooled copper foil, this foil will be layer ten.
3. Next place the untooled prepreg, this is all the prepreg between layers 9 and 10.
4. Place the bonded package along the two perpendicular laser lines. The bonded package consists of layers 2-9 with all the associated prepreg bonded in between all the layers.
5. Place the untooled prepreg, this is all the prepreg between layers 1 and 2.
6. Place the untooled copper foil, this foil will be layer 1.
7. Place the next separator plate and repeat the process for the entire book.

Figure 6:
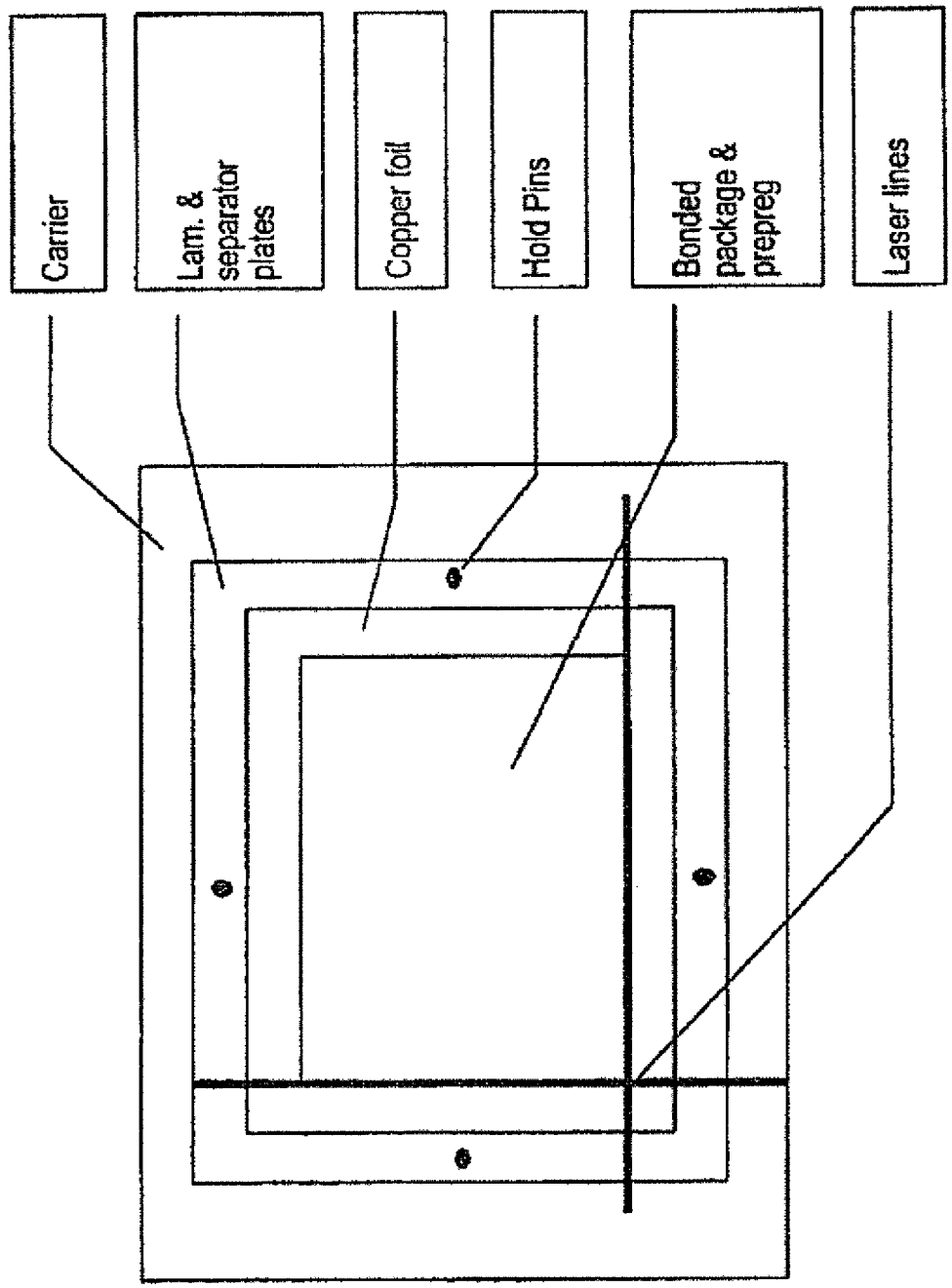
FIG. 6 is an exemplary image of a lay-up book using external holding pins enabled by an aspect of the proposed invention.

Referring now to FIG. 6 a representative example of the lay-up book construction using external holding pins is provided.

The following is a proposed process for laying up a book with external holding pins—for example a laying up a 10 layer board wherein lamination and separator plates have tooling holes outside of the panel area (for example, a 18"× 24" panel using 20"×26" lamination and separator plates with pins at the 20" and 26" locations). This technique uses lamination pins to hold the top and bottom lamination plates and separators in alignment to each other.
1. Place the lower lamination plate in position on the lay-up table and begin lay-up as usual up to the first separator plate.
2. After placing the first separator plate in location, insert the holding pins.
3. Pace the untooled copper foil, this foil will be layer ten.
4. Next place the untooled prepreg, this is all the prepreg between layers 9 and 10.
5. Place the bonded package along the two perpendicular laser lines. The bonded package consists of layers 2-9 with all the associated prepreg bonded in between all the layers.
6. Place the untooled prepreg, this is all the prepreg between layers 1 and 2.
7. Place the untooled copper foil, this foil will be layer 1.
8. Place the next separator plate and repeat the process for the entire book.

Following lay-up, drill tooling and flash routing are commonly conducted.

In drill tooling, the tooling holes for drilling are placed by an x-ray drill tooling system known to those skilled in the art. These drill tooling machines are typically capable of drilling four holes. Two holes are ⅛" diameter on or close to centerline for drill tooling and two holes are used for flash routing and orientation.

In flash routing, the two holes for routing are ½" away from the drill tooling holes. These additional holes are ⅛" and 3/16" diameter and are for orientation and for pinning on the flash router. This technique ensures that the drill tooling holes will not be damaged prior to drilling.

As a consequence of the proposed pin-less registration system for providing aligned and bonded packages to the lay-up process a number of advantages and cost savings are realized. These include but are not limited to: Flexibility utilizing lamination plates; Plates do not need tooling holes, this allows the plates to be used for multiple panel sizes, and thus fewer sets of lamination plates are needed; Separator plates also do not need tooling holes this allows the plates to be used for multiple panel sizes, thus less sets of separator plates are needed; Cleaner operation, cleaning plates are easier to clean, there are no resin filled tooling holes; Copper foil does not need clearances for tooling pins, foil is easily damaged when trying to lay-up on pins, this problem in eliminated; Prepreg does not need clearances for tooling pins which this minimizes prepreg dust; There will be more flexibility in panel sizes without the restrictions of the pins; The lamination pins and bushings are eliminated, thus eliminating a consumable; and depinning is not necessary.

B. Description of an Integrated System for Pin-Less Registration System (PRS) Operation Employing a Multi Camera Measurement Station (CMS)

What is proposed is a Pin-Less Registration System (PRS) that enables multiple inner layers to be registered together for pressing into a completed multilayered circuit board at a time desired by a manufacturer following an initial measurement by a multi camera measurement station (CMS). While the PRS system may be employed without an initial CMS system the use of a CMS system in concert with the PRS system brings enhanced performance, as will be discussed.

Figure 7:
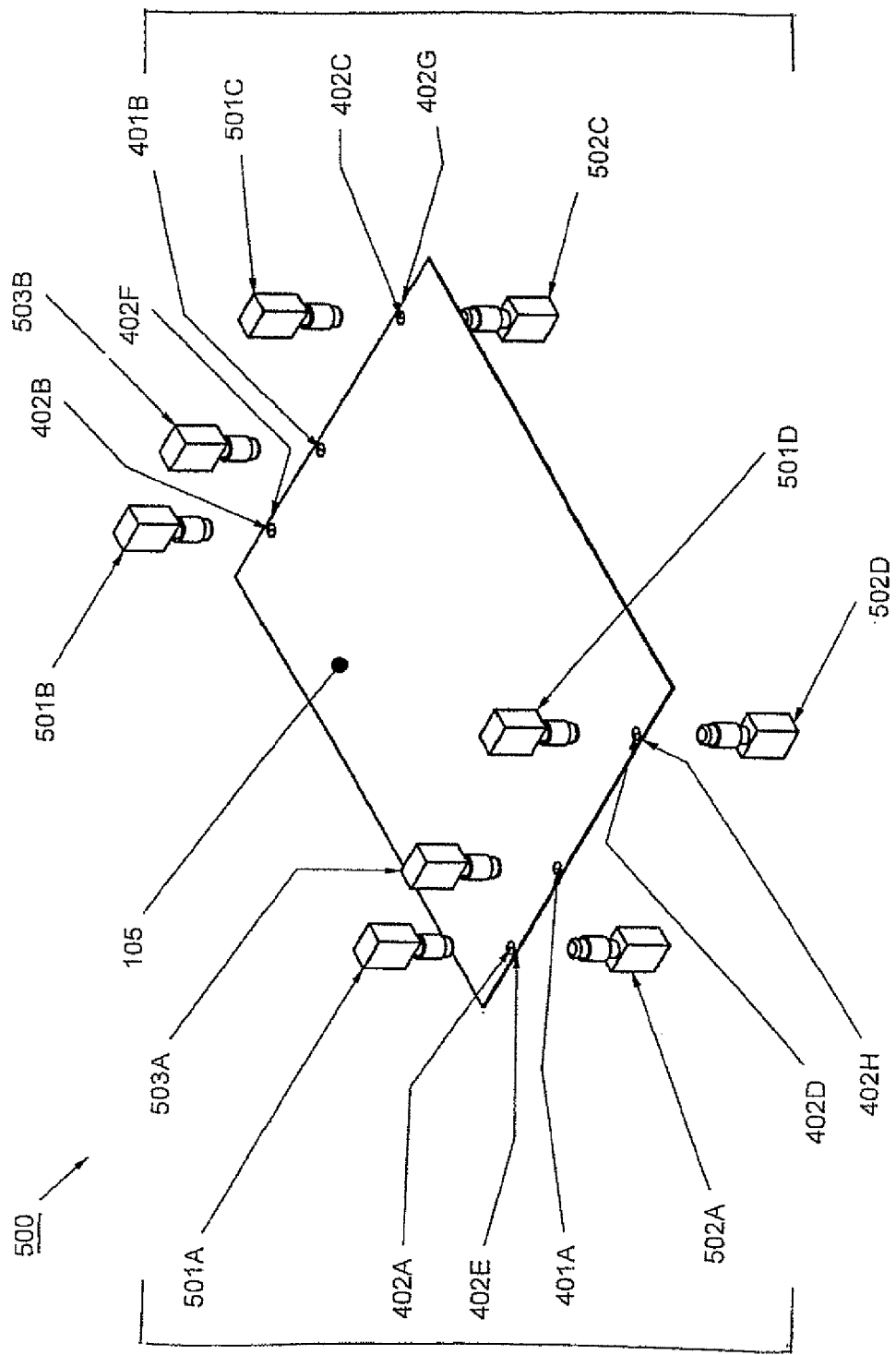
FIG. 7 is a perspective view of a multi-camera measurement station according to one aspect of the present invention.

Referring now to FIG. 7 a perspective view of an optional multi-camera measurement station (CMS) 500 within a mechanical supporting structure (not shown) similar to that in the PRS system (discussed later) the is provided with a first top set of cameras 501A, 501B, 501C, and 501D, and a second bottom set of cameras 502A, 502B, 502C, and 502D and respective centerline reference target image units 503A, 503B arranged along a centerline between respective target points 401A, 401B for later interlayer alignment from a preset position of a first alignment layer 105. As will be recognized by referencing the figure, top set of cameras 501A-D and bottom set of cameras 502A-D image respective top targets 402A-D, and 402E-G on layer 105. Collectively the imagery or alignment data generated by the CMS system is commonly referred to as a first reference orientation data set for the particular sheet. Thereafter the first reference orientation data set may be pushed through various algorithms to determine best fit and other details relevant to a desired alignment, the centerline, or other standards as may be determined by a customer. Ultimately, following the generation of a group of first reference orientation data sets for respective sheets 105, and the calculation (to be discussed), a preferred stack orientation may be calculated for a combination of the multiple laminate sheets optimized employing the first reference orientation data set.

As noted earlier, the pin-less registration system (PRS) provides for pin-less lamination of multilayers and sequential lamination build up technology. Consequently, the PRS approach utilizes machine vision technology to pre-align layers during lay-up (discussed above) and then bonds the internal book together, securing the alignment during the press cycle. To optimize the PRS system it is preferred (but not required) to employ the CMS system for processing multiple layers prior to later assembly at the PRS station. As will be discussed later, the PRS utilizes two cameras on centerline for inner layer alignment, and due to the lay-up process it would not be achievable to align the layers to top and/or bottom targets in the alignment station. Consequently the CMS measurement station employs a total of at least ten (10) imaging cameras to determine overall fit and an initial centerline alignment for later reference.

The addition of a Measurement Station allows for either positioning to "the more critical layer" or "split-the-difference from top to bottom" allowing a user to determine which process best fits the manufacturing need.

The best-fit location is calculated based on a reading of all cameras and is within the computer control system referenced to the two top centerline reference targets 401A, 401B for later positioning in the PRS system. In effect the computer control system for the CMS and PRS systems cooperate to calculate the offset of the top centerline targets to the best fit position of the remaining 8 alignment targets on the outer corners of each sheet 105 shown as 402A, B, C, D, E, F, G, and H (4 targets on top, 4 targets on the bottom). As was earlier discussed, a pre-alignment station may be used to augment the process still further.

In the proposed system, each respective layer 105 to be aligned is first placed in the measurement station (CMS) so that the targets are in the field of view of the cameras. The Measurement Station images the layer 105 and employing electronic computational analysis obtains both the initial orientation data set and the calculated the best fit position and checks target tolerance criteria of top and bottom targets at positions 402A-402H. Additionally, the measurement station now calculates the relative position of the two top targets to the best fit position and sends the data to a database for later reference by the PRS alignment station. It shall be recognized that the proposed storage database may be within the PRS alignment station (to be discussed), or elsewhere for example within a centralized management computer system (server) accessible by the CMS and PRS systems without departing from the spirit and scope of the present invention.

Following all necessary measurements, layer 105 is physically transferred to either longer-term storage for later use or the to-be discussed PRS for lay-up, at this point the PRS utilizes the best positional data calculated for that layer by the Measurement Station, and aligns the layer (as will be discussed.) The CMS measurement process is then repeated for all layers and after assembly at the PRS lay-up is completed the bonding cycle takes place.

Referring now to FIGS. 8 through FIG. 19B, a pin-less registration system (PRS) 400 is discussed. The PRS 400 system uses a machine-vision system, which locates fiducial targets, in conjunction with an X-Y-Y positioning table to manipulate each inner layer to a predefined location, where a system of clamps holds the layer in place (as will be discussed).

Generally, during operation (as will also be described in a sequence-of-operation below), each successive layer (previously imaged by the CMS) of the to-be-created multilayered circuit board is loaded into the PRS machine, along with a sheet of pre-preg (resin sheet) insulating material, via a gripping loader system, where it is positioned and clamped. When all of the inner layers are positioned, a set of welding heads is engaged. The heads spot-weld the inner layers and pre-preg together forming a securely joined panel.

When the welding process is complete, the gripping loader system (to be disclosed) is used to eject the completed panel to an external unloading device.

As constructed, the controlling computer system for the PRS performs various Statistical Process Control checks to ensure that the layers are within inputted allotted positional and material tolerances employing selected algorithms. In a preferred embodiment, the system makes use of a touch-screen monitor to provide the main user interface in a convenient manner. The system is controlled and configured via the touch-screen interface. When necessary, a virtual keypad is displayed on the screen, allowing for the entry of set points and configuration information, or the retrieval of previously stored (on a network server for example) initial data regarding a particular layer 105.

General System Description:

The PRS Pin-less Registration System is comprised of the following major components:

Compatible computer or computer control system or systems such as a server-centralized system.

Runs a dedicated, custom control application, which provides the operational functionality and user interface described herein—including movement control and data management.

Touch-screen monitor (preferably operating as an input interface)

Provides a means of displaying a custom designed user interface, and allowing for easy operator interaction at a manufacturing location, including (optionally) a virtual keypad used to enter set points and configuration and other data.

Machine Vision Cameras (as discussed)

Provides images of the fiducial targets.

Vision Processing Algorithms housed within the compatible computer or computer systems.

These processing programs enable configurable, trainable algorithms that provide the method for locating the fiducial targets in the field of view of the cameras. The algorithms are configurable for multiple shape, size, and search acceptance criteria.

Motion System

Provides the means for mechanical and electrical material input and output from the machine.

Provides the means of operational sheet manipulation inside the PRS machine, such that the layers are moved to predefined and controllable positions.

Provides configuration of the machine to the material based on the panel size input via the touch-screen interface.

Spot Welding System
    Provides the means of holding the layers together for further processing outside of the PRS, for example an induction bonding head may be employed as a spot welding system.
Machine I/O System
    Provides the electromechanical (pneumatic, hydraulic, electronic, mechanical, sensor) means for controlling the grippers, clamps, platen, etc.
        Includes both outputs to devices, and inputs from various sensors.

Generally, during "Machine Operation," once the system is powered up and the PRS software controller application initialized, the system is ready for operator interaction. In practice, the operator employs a "Job Setup" interface screen to describe the customer-defined job parameters (including, for example, how many layers are to be positioned per panel, the "X" Panel Size (for example 18"×22"), particular Weld Head operation parameters, and whether SPC or other analysis will be utilized).

Once the Setup information is complete, the operator initializes the PRS system 400 for operation. This is done via additional buttons on the User Interface. The system initializes all axes of motion, and moves the cameras to the designated X Panel Size. The Platen, Clamps and Gripper system are similarly configured for operation.

As will be later discussed in detail, an operator places the first inner layer 105 to be positioned on the loading station. A set of cameras and monitors in the operator loading station are used to facilitate pre-positioning with relation to the grippers and tooling inside the machine. When the operator is ready, a start button is actuated. The mechanical grippers grab the layer, and drag it into the machine, placing the layer at the proper computed position, based on the input X Panel Size, so that the fiducial targets are visible within the field of view of the multiple cameras inside the machine.

Once inside, the platen system is engaged to grip the layer from above. A vacuum generator holds the layer, while a sub-platen is used to lift the layer above the base plate and any other clamped layers. A multi-camera measurement system within PRS machine 400 analyzes the target fiducials from within the camera fields of view, and computes any additional correcting manipulation moves (to achieve for example a best fit). The X-Y-Y table is used to position the inner layer accordingly. The vision system is re-checked for positional accuracy. The sub-platen places the layer firmly on top of the base plate or pile of clamped layers between each move. If the layer is within the configurable positioning tolerance, the layer is clamped, the platen raised, and the system is ready for the next layer. While the layer was being positioned, the loading grippers are returned to the load position, to be ready for the next layer.

When all layers have been positioned and clamped, the weld heads are engaged, for a configurable time profile, to secure layers 105 together. Once complete, the loading grippers are used to eject the completed panel from the PRS system 400 and the process begins again.

During processing, the vision system is used to ensure that the fiducial targets are the right type, size, and orientation. Statistical Process Control computations are performed on each layer, relative to the first, to show relative expansion/contraction of each successive layer.

Figure 8:
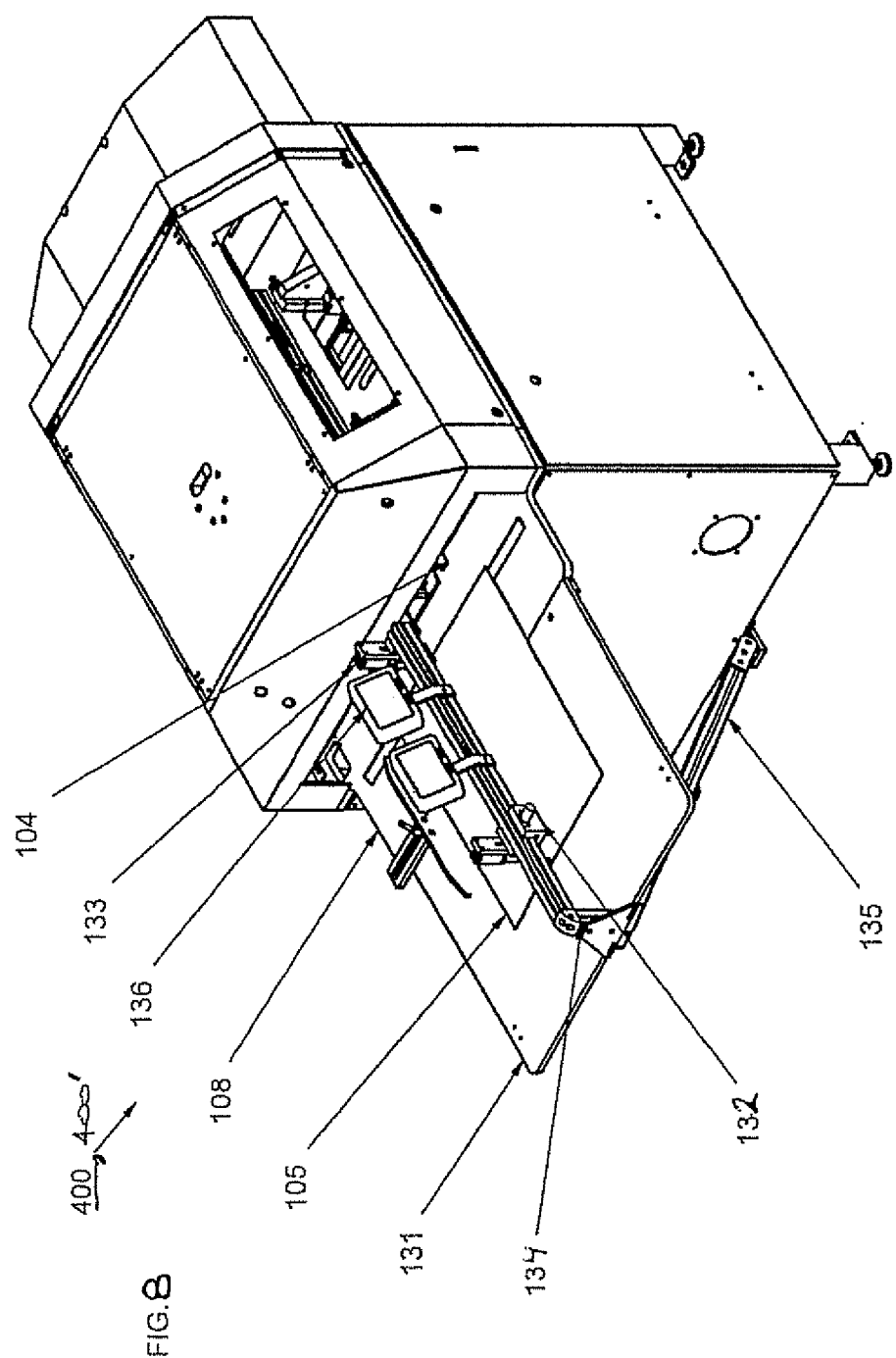
FIG. 8 is a perspective view of a pin-less registration system (PRS) device according to one embodiment of the present invention.
Figure 9:
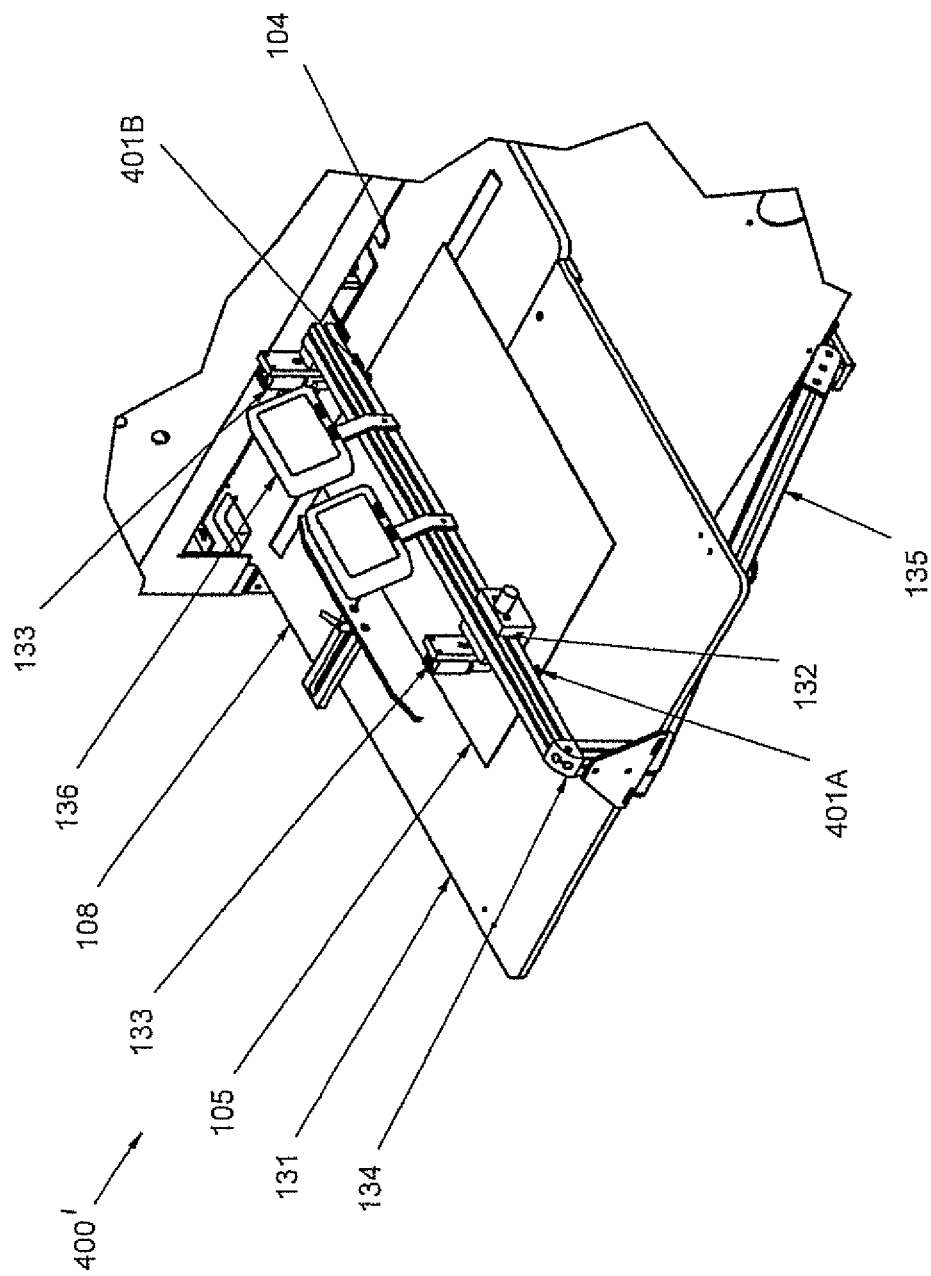
FIG. 9 is a close-up view of an operator loading station as shown in FIG. 8.
Figure 10:
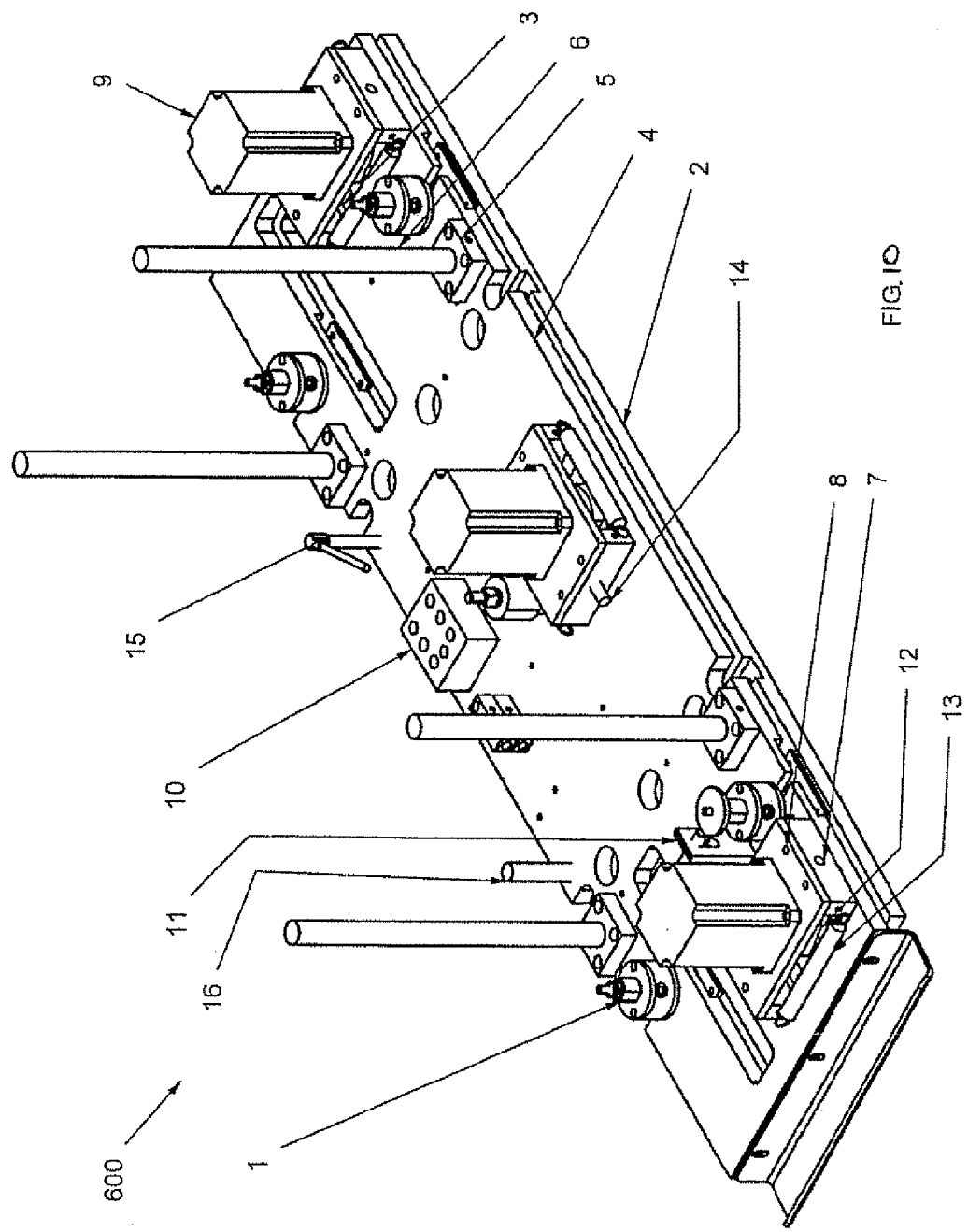
FIG. 10 is a perspective view of an internal alignment table assembly within the PRS system.
Figure 11:
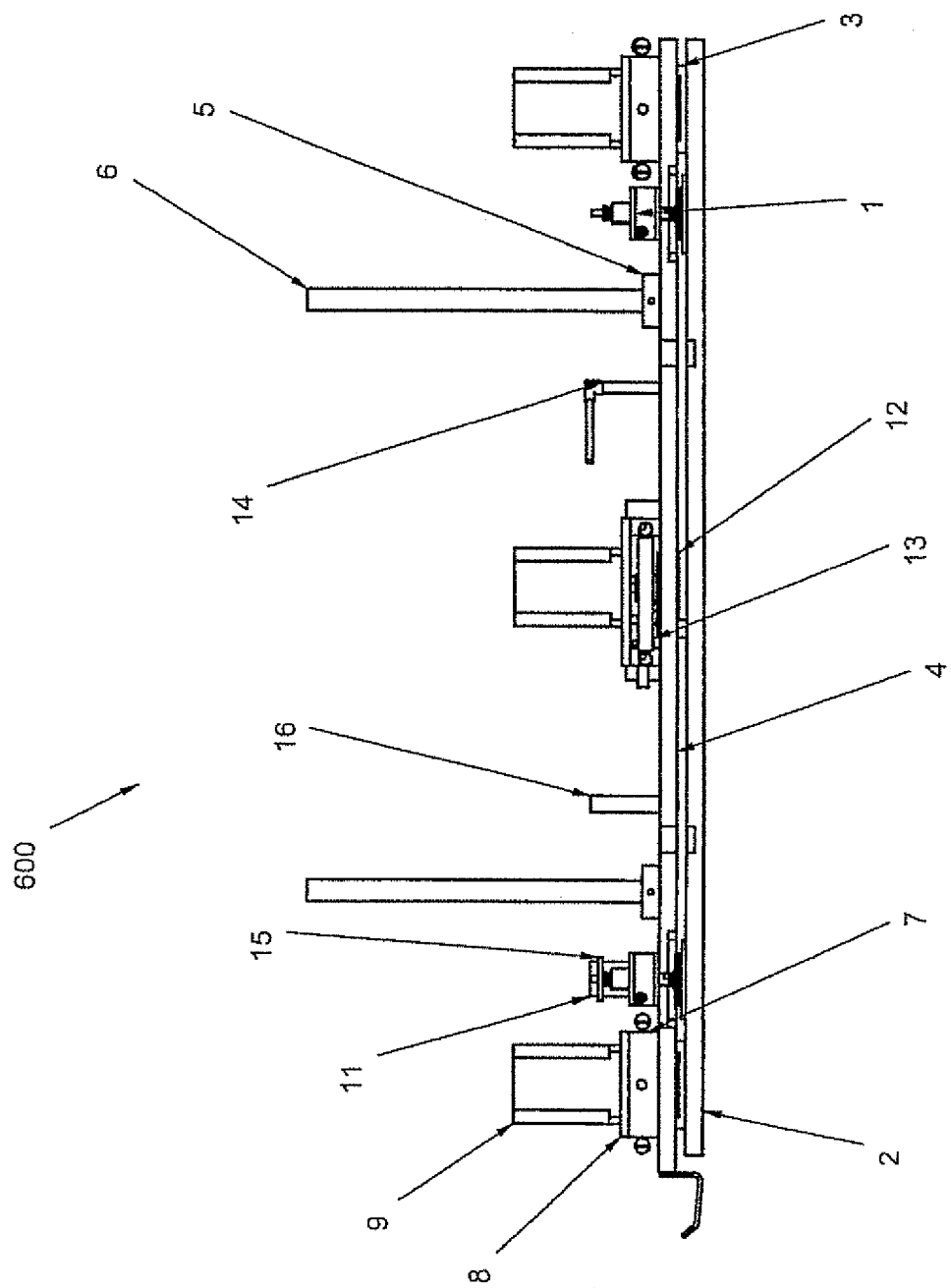
FIG. 11 is a side view of an alignment table assembly in FIG. 10.
Figure 12:
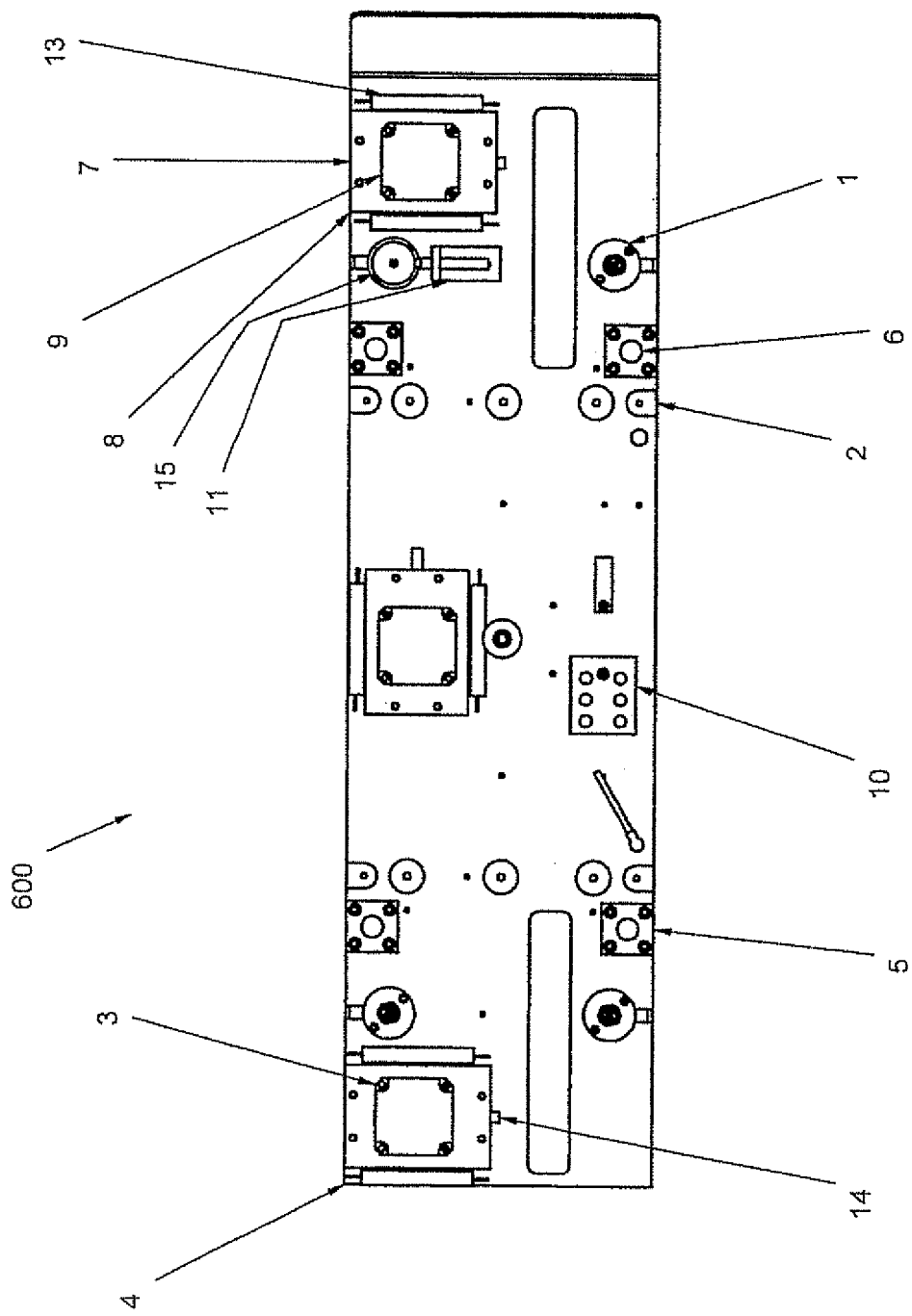
FIG. 12 is a top view of an alignment table assembly as in FIG. 10.
Figure 13:
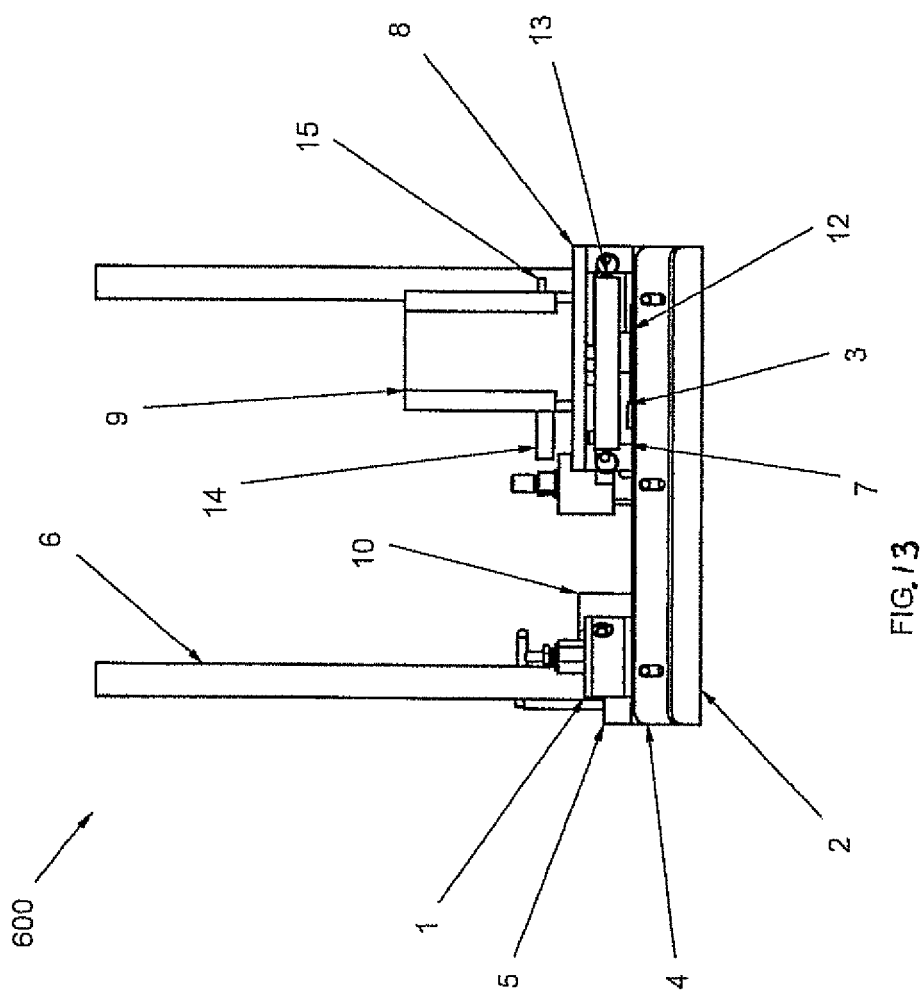
FIG. 13 is a left-side end view of an alignment table assembly as in FIG. 10.
Figure 14B:
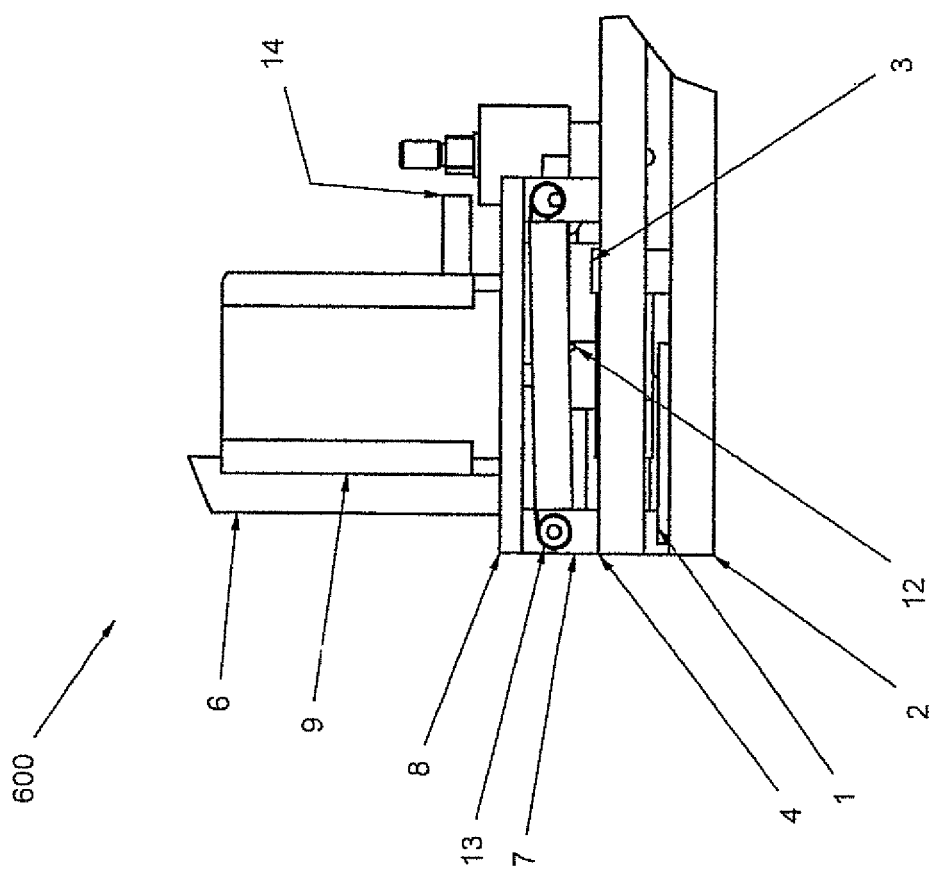
FIG. 14B is a close up view of detail A in FIG. 14A.
Figure 14A:
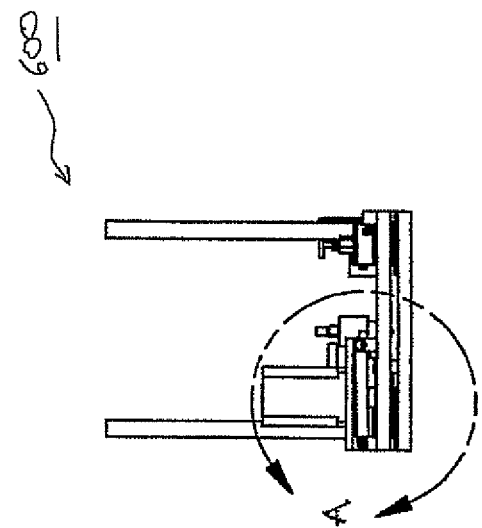
FIG. 14A is a side view of an alignment assembly as in FIG. 13 noting close up detail A.
Figure 15:
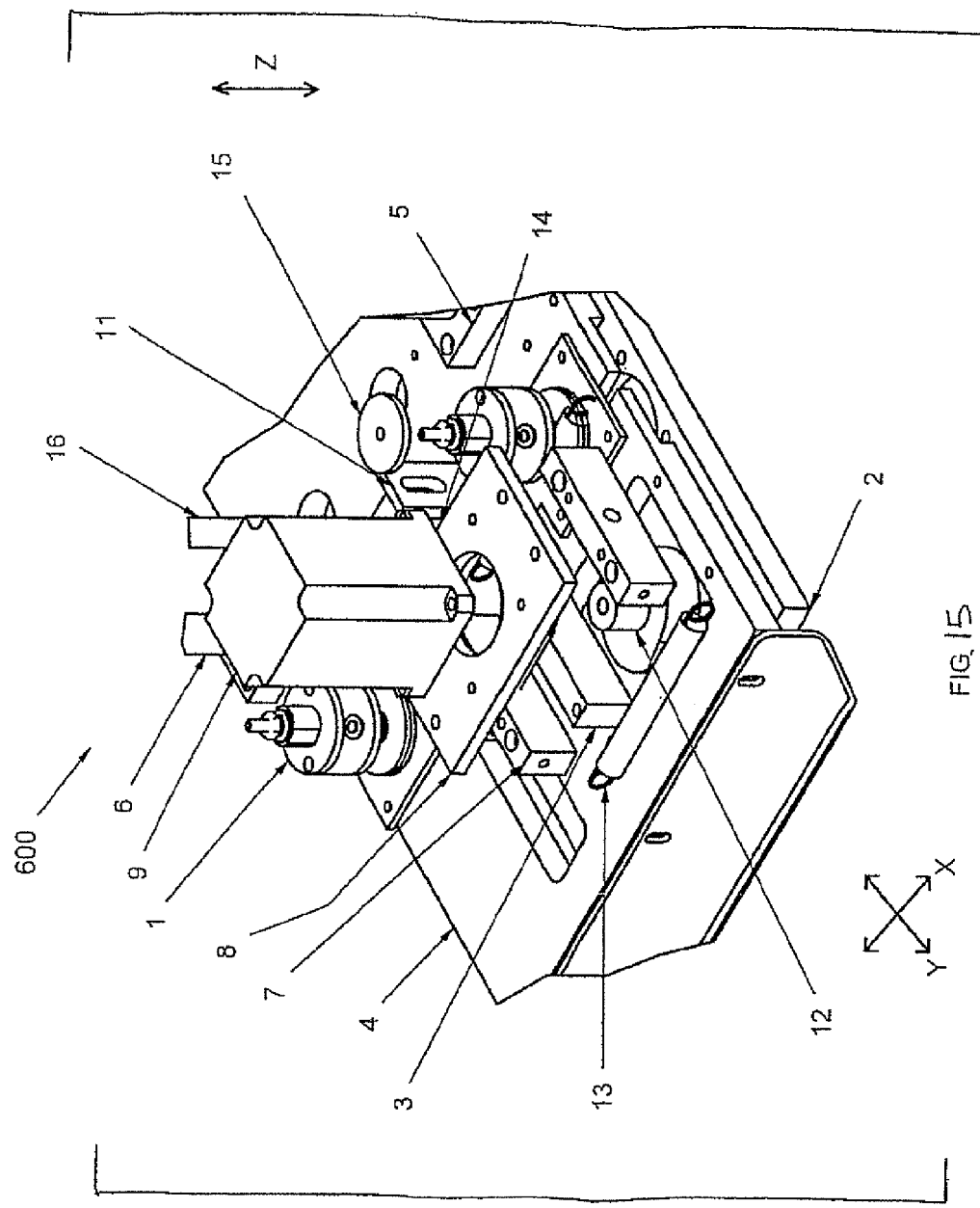
FIG. 15 is a partial exploded view of a cam positioning assembly in the alignment table assembly in FIG. 10.

Referring directly now to FIGS. 8 and 9, a pin-less registration system 400 is provided with a pre-alignment or measurement station 400' extending external to an inner imagery and positioning system as will be discussed. Pre-alignment station 400' may also be referred to as an operator loading station, and includes supporting loading table 131, braced by loading table support 135 to provide a stable platform for receiving typical layer 105 below a camera slide 132 supported by an end bracket 134, as shown.

Typical layer 105 includes central reference targets 401A, 401B (as earlier discussed and not shown) for viewing by two lateral CCD cameras 133, 133 positioned on camera slide 132. A LCD pair of load monitors 136, 136 provides visual feed-back to operators for pre-aligning typical layer 105 relative to respective targets 401A, 401B. Following pre-alignment load gripper assemblies 104, 104 operate relative to a front work plate 108 for the PRS device 400 to grip layer 105 following initial operator alignment and data entry and retract (to the right in the views) it into the PRS machine in an aligned and re-set manner depending upon pre-alignment data readings via CCD cameras 133, 133.

It is procedurally envisioned, that operators employing pre-alignment station 400 follow the following process:

1. Operator inserts inner layer 105 for a first layer into the Pre-Alignment Station 400'.
2. Target are in the field of view of the Pre-Align CCD cameras 133, 133 as determined by inspecting images on screens 136, 136.
3. Operators presses start button (not shown) of the automating loading and alignment system.
4. The two loading grippers grab the layer and raise it for movement (approximately 20 cm).
5. The layer is now pulled into the PRS positioning system 400 and placed in the field of view of the main positioning cameras arrayed in a manner similarly discussed in the computer measurement system (CMS) or in another manner effective to achieve the benefits of the proposed invention.
6. The load grippers return to the load position as the PRS begins the alignment.
7. The operator inserts the next layer and the prepreg sheet.
8. Steps 2 to 7 are repeated for all layers in that panel.
9. Once the last layer is aligned, the panel is welded/bonded.
10. After the bond cycle, the second set of unload grippers grab the bonded panel and send it out of the machine.
11. During step 9-10 the operator repeats step 1-3
12. Once step 10 has completed the machine will repeat steps 4-10

A slightly modified and alternative process is noted as follows and includes the earlier discussed CMS system for enhanced accuracy:

1. Operator inserts a defined inner layer for first layers into the Measurement Station of the CMS.
2. The Measurement Station calculates a best fit position and electronically transfers the data to the PRS alignment station or other controlling computer system.
3. The operator now physically moves the layer into the PRS positioning work area.
4. The PRS alignment station 400' of PRS 400 aligns layer 105 to the calculated best fit position via machine vision technology and multiple axis movement (as will be discussed). Two cameras are used to detect the two centerline top targets.
5. The inner layer is aligned and held in place by two sets of edge grippers.
6. The center vacuum platform is raised and the next inner layer with the associated sheets of prepreg is introduced into the work area.
7. The vacuum platform is lowered onto the inner layer, thus completely flattening the inner layer.

8. Vacuum is then activated and the platform raises less than 0.015", the CCD or CMS similar 4-10 camera system digitize the earlier identified targets and a positioning system moves the inner layer to the optimally aligned position. For example an initial sheet may employ a bottom or other view while following sheets may commonly employ only a top view (4 camera view).
9. The platform is lowered and the vision system rechecks the alignment, the grippers release and regrip, the grippers now hold both inner layers with the prepreg sandwiched between them.
10. Steps 4 through 7 are repeated for the successive inner layers for a given panel.
11. When the lay-up is completed, the bond cycle is activated and the layers are held in position at six bonding locations. The operator removes the bonded package and begins the next lay-up.
12. The bonded package is processed in the multilayer press without pins as a four layer PCB.

While non-limiting to the present disclosure, the following are proposed specifications for a potential PRS system.
Positioning System Repeatability: +/−17 micron-+/−0.7 mils. (Checked with dial indicator on positioned panel)
Panel sizes: Min 300×455 mm (16"×18"), Max 610×760 mm (24"×30")
Panel alignment speed: 7 seconds/layer average (dependent on target quality and operator pre-alignment speed)
Positioning system: X-Y-Y axis, cam driven, closed loop system thru CCD cameras
Bonding Type: Inductive (preferably)
Bonding panel thickness: Greater than CCD depth of field
Target size diameter (suggested): 0.75 mm-1.5 mm (0.030"-0.060")
Vision System
Types of cameras: Synchronized Image CCD elements
Depth of field: 8 mm (0.320") but not limited thereto
Illumination: UV LED ring lamps
Inner layer Copper type: No limitation
Pre-preg type: No limitation Thus, those of skill in the operational and system arts should recognize the following highlights of the proposed system operation.

The PRS system 400 uses the results of Vision Processing Algorithms to determine the current position of an inserted layer 105. That position is calculated, in relation to a pre-defined X-Y location within the machine, relative to the welding heads (not shown). The difference is computed in teens of X, Y1, and Y2 moves, and used as input for the motion and gripping systems (to be discussed).

The weld heads are configured to operate at individually set temperatures. The heads are active, but idle, until the proper time for welding. At that time, the heads are brought to the configured temperatures, and engaged to weld the layers together. At a configured time, the heads return to the idle state, and a series of air cooling jets are used to cool the heads and the spot welds, and the completed panel is ejected from the system.

In reviewing the above, those of skill in the art should recognize:
The vision system analyzes the target fiducials from within the camera fields of view in manners known to those of skill in the imaging arts. Here, the system performs a grayscale search for a trained image. This search is tolerant of defects in the target and variations in lighting and contrast. The search returns results of score, scaling, rotation, and position (X, Y).

The results from each camera are validated based on a readily configurable limits (for score and scaling). The positions (X & Y) are then processed with the following computations:
The X & Y coordinates of each fiducial target are computed in relation to a set of X & Y configurable Reference Positions. The error is computed in X and Y.
The errors for each camera are related to moves that we can make using the X-Y-Y table. In this case, the X errors are averaged (since any X move moves the entire panel in X, any move made will affect both sides). The Y errors are handled independently, since the system can move the left and right sides independently.
A final set of X, Y1 and Y2 moves are computed, based on the configurable entries of camera Pixels Per Mil, and Motor Steps per Mil. In addition, a computation of this layer's spread (expansion or contraction) in relation to the first layer positioned is computed. If this is the first layer, the spread is (by definition) 0.
A decision is made as to whether the layer is within the configurable positioning tolerance (X, Y1, and Y2) or not. If the layer is not in position, it requires a move and raises a preferred decision operator flag. Note that the system will only make up to a configurable limit of moves before aborting the positioning procedure under the present programming.
The Sub Platen is raised, holding the top layer via a vacuum lock.
The X-Y-Y table is moved based on the corrective moves computed above.
The Sub-Platen is lowered, but still holds the layer via the vacuum lock.
The vision system again analyzes the target fiducials, and the process begins again.
Once the layer is in position:
If the system is configured to utilize the spread computation, the layer's spread is compared to the configurable limit. If the layer is within tolerance, it is gripped via the clamping mechanism. The layer is held in place so that the next layer can be loaded on top and manipulated without affecting the stack up of layers already in the machine.
If the layer is out of tolerance, the operator is given the choice as to whether to reject this layer or to clamp it anyway. If this layer is rejected, it is manually removed from the machine, and the system is then ready for the next layer to be loaded. The rejected layer does not count towards the number of layers required for the final stack up.
If the spread tolerance enforcement option is disabled, the layer is always clamped.
Once all of the required layers are present, positioned, and clamped, the system begins the bonding process.
The weld heads are engaged, and come up to the configured temperature profiles.
The weld heads are allowed to operate for a configurable time profile, to secure the layers together.
When the weld time is complete, the heads are deactivated. A set of air cooling jets is utilized to cool the material for a configurable time.
Once complete, the heads are disengaged, and the loading grippers are used to eject the completed panel from the system.

As noted above, the common "sequence of operation" is as discussed in the following steps:

1. The operator places the first layer in the machines work area with the two alignment targets in the field of view of the two cameras, and presses the start button.
2. The alignment/vacuum platform is lowered on top of the layer, this completely flattens the layer thus ensuring correct positional calculation of the center-to-center distance of the targets.
3. The unit aligns the layer to a preset zero position via machine vision technology and multiple axis movement. ("X", "Y1" "Y2" and "Z" axis)
4. Once in position, the layer is held in place by two sets of edge clamps.
5. The alignment/vacuum platform is raised and the next layer with the associated sheets of prepreg is introduced into the work area.
6. The alignment/vacuum platform is lowered onto the layer, thus completely flattening the layer.
7. The unit aligns the layer to a preset zero position via machine vision technology and multiple axis movement. ("X", "Y1" "Y2" and "Z" axis)
8. Once in position, the first aligned layer, prepreg and second aligned layer are held in position by the alignment/vacuum platform.
9. The clamps release the first layer, move out of position and then re-clamp, the clamps now hold both layers with the prepreg sandwiched between them.
10. The vision system rechecks the alignment of the top layer and then the alignment/vacuum platform is raised for the next layer and prepreg to be aligned.
11. Steps 5 through 10 are repeated for the successive layers for a given multilayer panel.
12. When the lay-up is completed, the bond cycle is activated and the layers are held in position at the bonding locations.
13. The operator removes the bonded package and begins the next lay-up.

This process eliminates all tooling hole and lay-up tolerances and optically aligns all layers to either top, bottom or both sets of targets. As noted earlier, the PRS system enables the following benefits:

Elimination punched or drilled holes, this is more accurate because it also eliminates all the hole tolerances
Align layers to most critical layer, may be the bottom layer
Align to best fit position of top/bottom of layer
Align sub-assemblies to via or drilled holes
Improved layer-to-layer registration through PC based machine vision capability.
Elimination of post-etch punch process steps and associated labor.
Maximum process flexibility by eliminating panel-size specific tooling.
Automatic and semi-automatic versions available.
Small footprint as compared to post-etch punch.
Improved X-ray drill performance.

Referring directly now to FIGS. 10 to 19B, an alignment and assembly table system 600 includes multiple X-Y-Y bearings 1 positioned relative to a vacuum plate 2 enabling operation of a series of cam followers 3.

A lift plate 4 supports the same and shaft clamps 5 secure vertical shafts 6 for vertical motion. Respective securing brackets 7 secure mounts 8 for engaging stepping motors 9 to operate system 600. Computer controlled vacuum manifolds 10 enable gripping of sheets 105 during operation. A bracket sub-platen sensor 11 enables reliable sensing during movement. Cams 12, operable with cam shaft springs 13 enable secure adjustment as will be explained.

A series of sensors including proximate sensor 14, actuator and sensor set 15, and panel sensor 16 enable secure computer control of system 600 and enable a managing computer system to determine precise location of all movement within system 600 of PRS system 400.

As is visually noted there are preferably at least four bearing assemblies 1 provided for multi-axis adjustment, although other configurations are contemplated. There is also a plurality of control-ably driven stepper motors 9 for rapid adjustment as shown.

Referring now to FIGS. 17, 17A, a bearing assembly 800 containing bearing member 1 is provided with an air cylinder 1', a pair of slide bearing 2' and bearing plates 3' (fixed) and 4'(movable). A stroke adjuster 5' is provided for adjustable operation there between and a threaded member 6' fixed by a nut 7' secures a washer 8' and lock washer 10' relative to stroke adjuster 5' to secure an adjusted operation bearing position. An end member 9' secures bearing plates 3', 4' respectively.

Figure 18A:
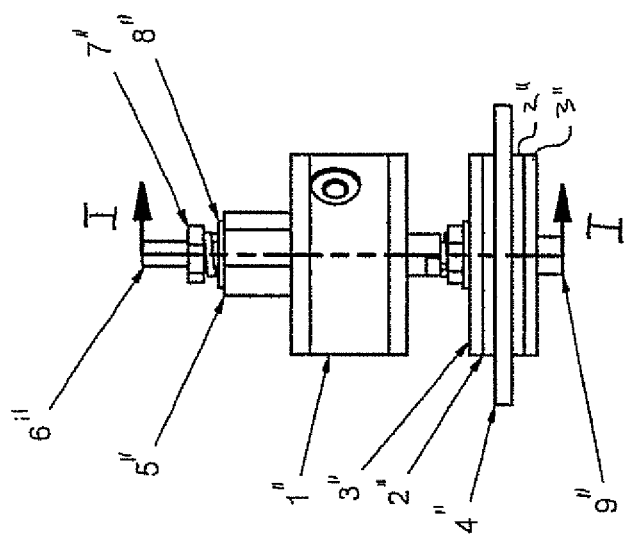
FIG. 18A is a top view of the alignment table assembly as in FIG. 12 noting section cut detail I-I of a bearing assembly.
Figure 18B:
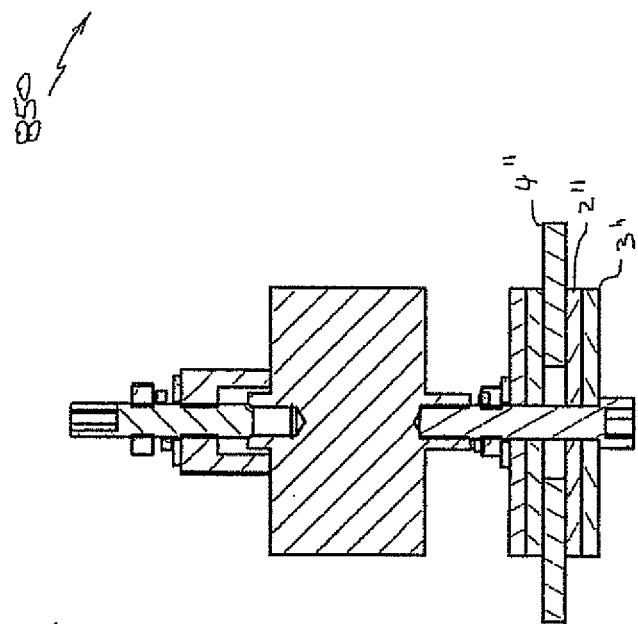
FIG. 18B is a cross-sectional view along section I-I in FIG. 18A.

Referring now to FIGS. 18A, 18B, bearing assembly 850 (like bearing assembly 800) for an X, Y, and Z slide member is provided in a simplified manner in support of the above disclosure. As noted an air cylinder 1" positioned relative to a set of slide bearings 2", 2" and a set of bearing plates 3" (top) and 4" (bottom) and enables adjustable motion of movable plate 4" relative to slide bearings 2". A stroke adjuster 5" and screw 6", nut 7", lock washer 10" enable operative adjustment understood by those of skill in the art. As disclosed movable bearing plate 4" is mounted to the vacuum plate discussed above for smooth and secure adjustment. A locking member 9" secures bearing plates.

Figure 19A:
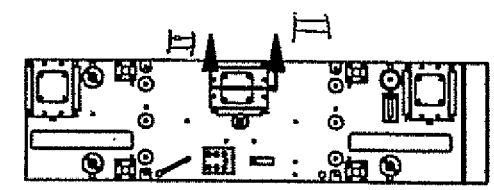
FIG. 19A is a side view of a bearing assembly.
Figure 19B:
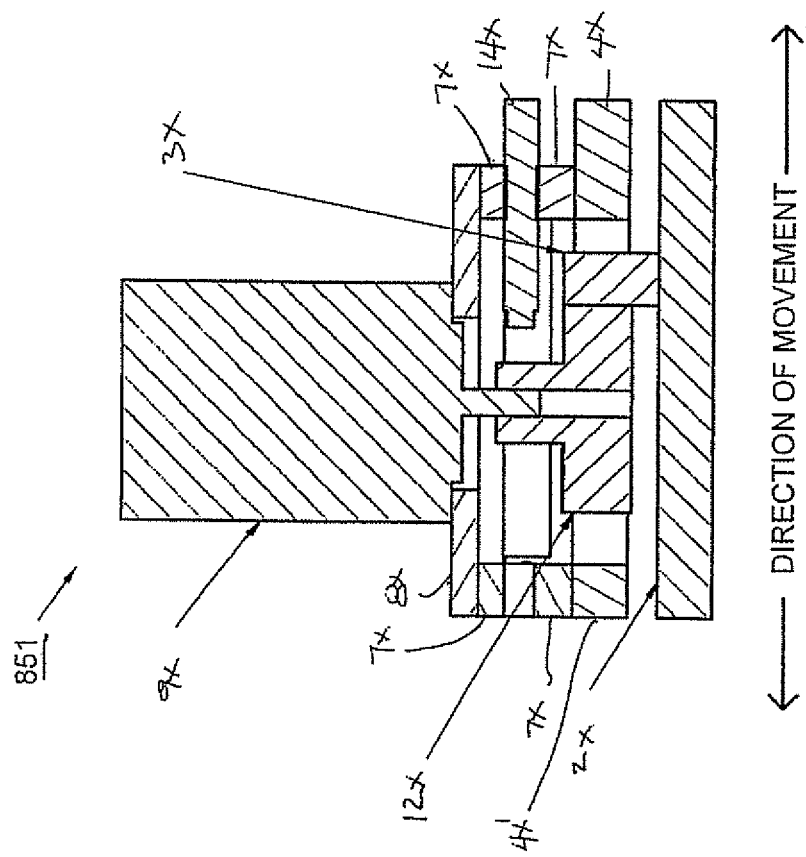
FIG. 19B is a cross-sectional view along section II-II in FIG. 19A.

Referring now to FIGS. 19A, 19B, a cam positioning system 851, discloses a vacuum plate 2x movable (as shown) relative to cam follower 3x and plate lifter 4x. A bracket 7x for holding a positioning motor 9x (stepper motor) enables operation. A mount 8x secures positioning motor 9x, and a positioning cam 12x and cam spring (not shown) enable cam-able operation and motion control of vacuum plate 2x tracked by a proximity sensor 14x.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A registration system for assembling a plurality of laminate elements in a selected stack orientation, the system comprising:
    first and second optical measurement means for optically receiving ones of said laminate elements, said first and second optical measurement means including electronic optical means for imaging portions of said laminate elements at a location distant from edges of said laminate elements, and said first and second optical measurement means further including means for determining a first reference orientation data set of each respective one said laminate elements;

computer operation control system means including a data processor for determining a required correction factor between said determined first reference orientation data set for each respective laminate element and said selected stack orientation during an assembly of said plurality of laminate elements, said computer operation control system instructing said data processor to calculate said required correction factor on an updated selected stack orientation incorporating said orientation of a previous laminate element;

pin-less alignment and positioning means for receiving said required correction factor and positioning instructions specific to each said laminate element and said location distant from said edges of said laminate elements from said computer operation control system and for positioning each said laminate element from a top position to said desired selected stack orientation during an assembly of said stack;

means for inductively bonding at least a first and a second laminate structure at some of said plurality of laminate elements in said selected stack orientation, said means for inductively bonding receiving a bonding instruction from said computer operation control system following a completion of said assembly of said plurality of laminate elements in said selected stack orientation; and said means for inductively bonding electrically coupling portions of said laminate elements upon receipt of said bonding instruction from said computer operation control system.

2. The registration system according to claim 1, further comprising:

an image target proximate said imaging portions of said laminate elements; and copper foil portions on ones of said laminate elements proximate said electrically coupled portions for inductive bonding whereby during an inductive bonding said copper foil portions are electrically coupled.

* * * * *